(12) United States Patent
Li et al.

(10) Patent No.: US 11,776,980 B2
(45) Date of Patent: Oct. 3, 2023

(54) METHODS FOR REFLECTOR FILM GROWTH

(71) Applicant: Applied Materials, Inc., Santa Clara, CA (US)

(72) Inventors: Luping Li, Santa Clara, CA (US); Jacqueline S. Wrench, San Jose, CA (US); Wen Ting Chen, Santa Clara, CA (US); Yixiong Yang, Fremont, CA (US); In Seok Hwang, Pleasanton, CA (US); Shih Chung Chen, Cupertino, CA (US); Srinivas Gandikota, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 680 days.

(21) Appl. No.: 16/819,023

(22) Filed: Mar. 13, 2020

(65) Prior Publication Data

US 2021/0288086 A1    Sep. 16, 2021

(51) Int. Cl.
| | |
|---|---|
| *H01L 27/146* | (2006.01) |
| *C23C 16/20* | (2006.01) |
| *C23C 16/14* | (2006.01) |
| *C23C 16/455* | (2006.01) |
| *H01L 21/67* | (2006.01) |

(52) U.S. Cl.
CPC ........ *H01L 27/1463* (2013.01); *C23C 16/14* (2013.01); *C23C 16/20* (2013.01); *C23C 16/45553* (2013.01); *H01L 27/14629* (2013.01); *H01L 27/14685* (2013.01); *H01L 21/67167* (2013.01)

(58) Field of Classification Search
CPC .......... H01L 27/14629; H01L 27/1463; H01L 27/14685; H01L 21/32136; H01L 21/76877; C23C 16/14; C23C 16/20; C23C 16/45553
See application file for complete search history.

(56) References Cited

U.S. PATENT DOCUMENTS

| | | |
|---|---|---|
| 7,074,690 B1 | 7/2006 | Gauri et al. |
| 9,343,372 B1 | 5/2016 | Bao et al. |
| (Continued) | | |

FOREIGN PATENT DOCUMENTS

| | | |
|---|---|---|
| KR | 20060066427 A | 6/2006 |
| TW | 201545332 A | 12/2015 |
| WO | 2018183287 A1 | 10/2018 |

OTHER PUBLICATIONS

Machine Translation of KR20060066427A (Publication Date Jun. 16, 2006).

(Continued)

*Primary Examiner* — Brook Kebede
(74) *Attorney, Agent, or Firm* — Servilla Whitney LLC

(57) ABSTRACT

Methods and apparatus for forming reflector films are described A liner is formed on a substrate surface followed by formation of the reflector layer so that there is no oxygen exposure between liner and reflector layer formation. In some embodiments, a high aspect ratio structure is filled with a reflector material by partially filling the structure with the reflector material while growth is inhibited at a top portion of the structure, reactivating the top portion of the substrate and then filling the structure with the reflector material.

17 Claims, 5 Drawing Sheets

(56) References Cited

U.S. PATENT DOCUMENTS

| | | | |
|---|---|---|---|
| 9,627,484 B1 | 4/2017 | Ando et al. | |
| 10,431,583 B2 | 10/2019 | Kim et al. | |
| 2002/0132472 A1* | 9/2002 | Park | H01L 21/76879 |
| | | | 257/E21.586 |
| 2015/0243708 A1 | 8/2015 | Ravasio et al. | |
| 2015/0243709 A1 | 8/2015 | Song et al. | |
| 2017/0040214 A1* | 2/2017 | Lai | H01L 21/32136 |
| 2017/0078539 A1 | 3/2017 | Madurawe et al. | |
| 2017/0114459 A1 | 4/2017 | Saly et al. | |
| 2017/0148670 A1 | 5/2017 | Lei et al. | |
| 2017/0194204 A1* | 7/2017 | Sowa | H01L 21/28568 |
| 2018/0233372 A1* | 8/2018 | Väyrynen | H01L 21/28562 |
| 2019/0259797 A1 | 8/2019 | Li et al. | |
| 2019/0326284 A1 | 10/2019 | Kim et al. | |

OTHER PUBLICATIONS

PCT International Search Report and Written Opinion in PCT/US2021/021914 dated Jun. 25, 2021, 12 pages.

* cited by examiner

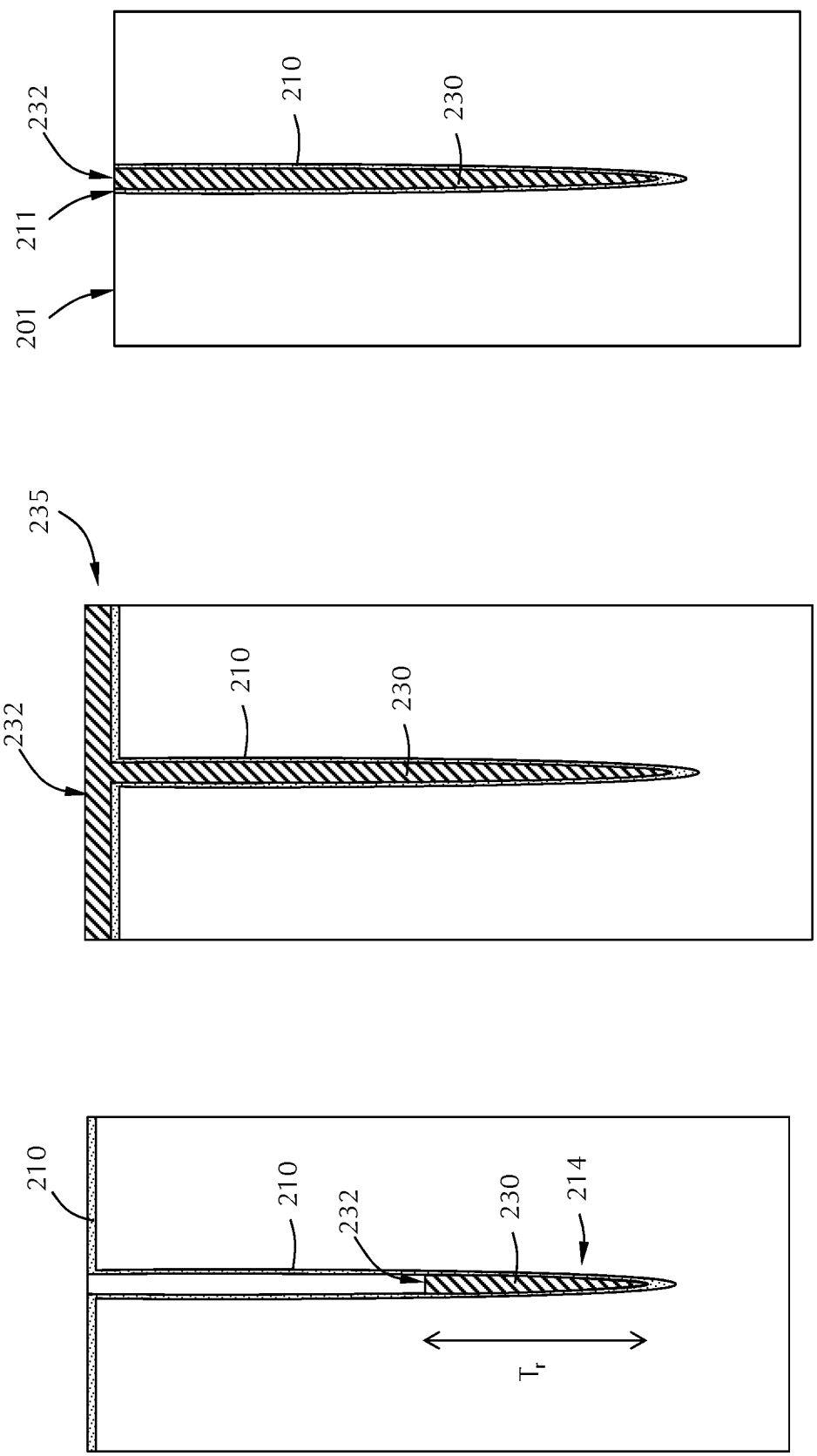

METHODS FOR REFLECTOR FILM GROWTH

TECHNICAL FIELD

Embodiments of the present disclosure generally relate to formation of reflector layers. In particular, embodiments of the disclosure provide methods and apparatus to grow reflector films in high aspect ratio (HAR) structures.

BACKGROUND

Many modern electronic imaging devices, such as those found in digital cameras, computers and cell phones, use digital image sensors that include an array of pixels. The pixels convert light into electrical charge. However some of the light received by a pixel is not absorbed and either passes into the underlying device components. In some devices, unabsorbed light is scattered into adjacent pixels resulting in cross-talk. The unabsorbed light and cross-talk or scattered light decreases the accuracy and lifetime of the pixels.

To minimize or prevent cross-talk, the individual pixels of contact image sensors (CIS) are isolated from adjacent pixels by a structure/technique known as deep trench isolation (DTI). Deep trench isolation uses a high aspect ratio structure formed in the substrate surface between the light sensing regions of the CIS. Deep trench isolation often uses a reflector material stack to reduce the optical cross-talk between neighboring pixels and, in turn, improves quantum efficiency of the CIS. The reflector material must be highly reflective to provide good optical isolation.

Additionally, growing metal films (e.g., aluminum) by chemical vapor deposition (CVD) can be a daunting task due to metal selectivity for the substrates. For example, CVD aluminum does not grow, or shows only minimal growth, on substrates that have been even slightly exposed to air.

Furthermore, forming films in the bottom of high aspect ratio structures can be difficult. As shown in FIG. 1, in some high aspect ratio DTI structures 10, the top portion 12 of the structure 10 is filled with a reflector material 16 while the bottom portion 14 of the structure remains unfilled. The unfilled portions decrease the effectiveness of the pixel isolation.

Accordingly, there is a need for methods for depositing reflector materials and for methods for improving DTI in high aspect ratio structures.

SUMMARY

One or more embodiments of the disclosure are directed to methods of forming a reflector film stack. A liner is formed on a substrate and a reflector layer is formed on the liner. The reflector layer is formed within the same process tool as the liner without exposure to oxygen between.

Additional embodiments of the disclosure are directed to methods of forming a reflector film stack. A conformal liner is formed on a substrate having at least one structure formed therein. The at least one structure has a bottom and sidewalls. The substrate is exposed to a growth inhibitor to deactivate a top portion of the substrate. A reflector layer is formed to an inhibited thickness on the liner within the at least one structure. The top portion of the substrate is reactivated. The at least one structure is filled with the reflector layer.

Further embodiments of the disclosure are directed to non-transitory computer readable medium including instructions, that, when executed by a controller of a processing tool, causes the processing tool to perform operations of: depositing a conformal liner on a substrate in a first process chamber connected to a central transfer station having a robot therein; moving the substrate from the first process chamber to a second process chamber connected to the central transfer station so that the substrate is not exposed to oxygen; exposing the substrate to a growth inhibitor in one or more of the first process chamber, the central transfer station or the second process chamber; forming a reflector layer on the liner in the second process chamber; and exposing the substrate to a reactivating agent.

BRIEF DESCRIPTION OF THE DRAWINGS

So that the manner in which the above recited structures of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

FIGS. 3A through 3G illustrate a process of forming a reflector stack according to one or more embodiment of the disclosure.

DETAILED DESCRIPTION

Figure 1:
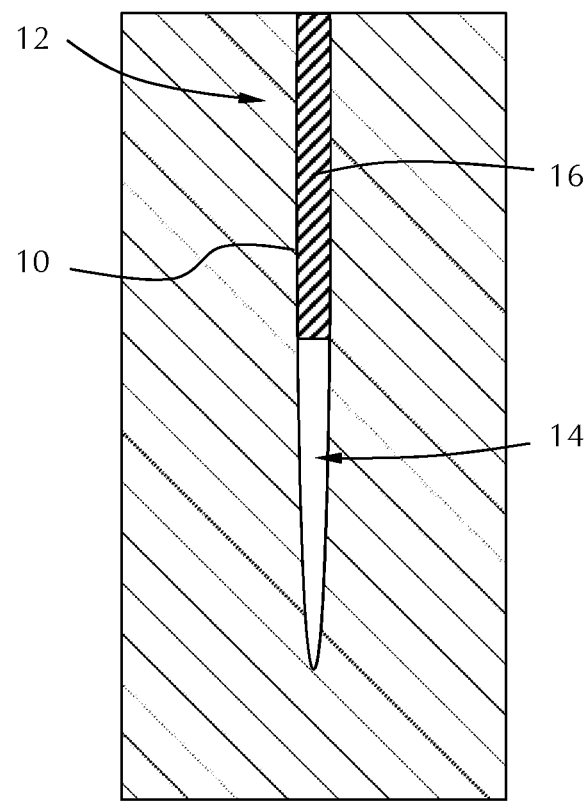
FIG. 1 shows a prior art CIS with an unfilled bottom section.

Before describing several exemplary embodiments of the disclosure, it is to be understood that the disclosure is not limited to the details of construction or process steps set forth in the following description. The disclosure is capable of other embodiments and of being practiced or being carried out in various ways.

As used in this specification and the appended claims, the term "substrate" refers to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or structures deposited or formed thereon A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal, UV cure, e-beam cure and/or bake the substrate surface. In addition to film processing directly on the surface of the substrate itself, in the present disclosure, any of the film processing steps disclosed may also be performed on an underlayer formed on the substrate as disclosed in more detail below, and the term "substrate surface" is intended to include such underlayer as the context indicates. Thus for example, where a film/layer or partial film/layer has been deposited onto a substrate surface, the exposed surface of the newly deposited film/layer becomes the substrate surface.

Some embodiments of the present disclosure relate to methods to grow aluminum (Al) thin films by chemical vapor deposition (CVD). Some embodiments advantageously provide methods for metal film growth on a substrate regardless of the chemical terminations. CVD aluminum films of some embodiments are grown using a liner film as a first deposition on the substrate in one deposition chamber. The substrate with the liner, according to some embodiments, is transferred under high vacuum to a second deposition chamber to grow a metal film with good reflectivity.

One or more embodiments of the disclosure provide effective methods to optically isolate pixels in contact image sensors. In some embodiments, the deposited metal film (e.g., CVD aluminum) has high reflectivity. The metal film of some embodiments is used to fill the gaps between pixels, preventing or minimizing pixel cross-talk. Some embodiments provide methods for deep trench isolation with higher signal-to-noise ratios than current methods. Some embodiments provide methods for deep trench isolation that provide enhanced device performance.

Some embodiments of the disclosure advantageously provide methods for growing CVD aluminum films with excellent growth behavior. In some embodiments, a liner material (e.g., TiAlC) provides an excellent surface for aluminum growth. In some embodiments, using TiAlC as a liner material, in-situ CVD aluminum can be deposited on substrates commonly used in semiconductor manufacturing. Some embodiments advantageously provide methods for metal gap fill that can fully fill trenches with aspect ratios of 50:1. Some embodiments provide gap fill methods with no or a minimal amount of seams or voids.

In contact image sensor (CIS) applications, tungsten (W) is conventionally used for deep trench isolation (DTI) of pixels. One or more embodiments of the disclosure provide methods for depositing highly reflective CVD films (e.g., CVD Al films) to replace tungsten for enhanced device performance.

In some embodiments, the liner choice affects the CVD aluminum film growth. Some embodiments of the disclosure provide methods for deposition of ALD TiAlC liners by clustering multiple deposition chambers without breaking vacuum, enabled sample transfer between chambers under high vacuum. ALD TiAlC liner in some embodiments is formed by alternating exposures to a titanium precursor and an aluminum precursor. In some embodiments, the ALD TiAlC deposition process ends with a titanium precursor exposure as the last reactive species.

In some embodiments, exposure of the liner to air suppresses CVD Al film growth. Some embodiments of the disclosure provide methods for forming CVD Al films with good deposition rates, resistivity and/or reflectivity.

In some embodiments, contact image sensor deep trenches with aspect ratio of 50:1 (~100 nm opening and 5 μm deep) were filled with CVD Al. Contrary to conventional CVD processes where continuous dosing is used; some embodiments separate each dose of 5-10 seconds by 10-20 seconds of purge between each dose. The overall film thickness in some embodiments was controlled by repeating the dose-purge cycle a number of times. In some embodiments, the inventors surprisingly found that separating each dose by a purge allowed for the complete filling of 50:1 aspect ratio structures with no seam and minimum voids.

Some embodiments provide methods to fully fill high aspect ratio (e.g., >100:1) with minimal or no seams or voids. According to some embodiments, a surface treatment is used to suppress metal film deposition on the top portions of the trench, filling the bottom portion of the trench. A second surface treatment activates the top portion of the trench for metal film deposition resulting in a full gap fill.

Figure 2:
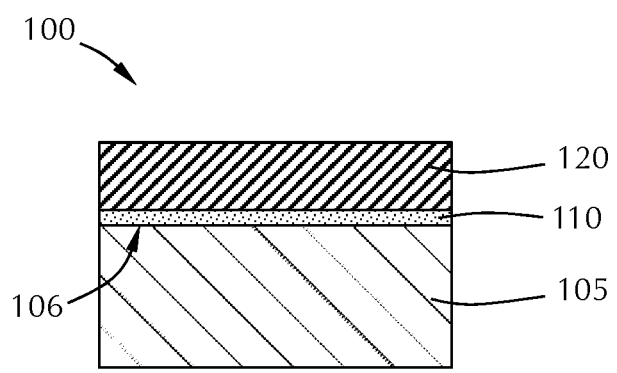
FIG. 2 illustrates a film stack according to one or more embodiment of the disclosure.

With reference to FIG. 2, one or more embodiment of the disclosure is directed to methods of forming a reflector film stack 100. A liner 110 is formed on the surface 106 of a substrate 105. The liner 110 can have any suitable composition and can be deposited by any suitable technique known to the skilled artisan. In some embodiments, the liner 110 is deposited by chemical vapor deposition (CVD). In some embodiments, the liner 110 is deposited by atomic layer deposition (ALD). In some ALD depositions, the liner 110 forms a conformal film on the substrate surface 106. A "conformal" film, as used herein, refers to a film with about the same thickness along the deposition. For example, in a trench formed in a substrate, a conformal film will have about the same thickness at the top of the trench as at the bottom of the trench. As used in this manner, the term "about the same thickness" means that the thickness does not vary by more than ±15%, ±10%, ±7.5%, ±5% or ±2.5% relative to the average film thickness.

In some embodiments, the liner 110 comprises titanium aluminum carbide (TiAlC). The skilled artisan will recognize that the use of chemical formulae for film compositions does not imply any particular stoichiometric relationship. For example, a titanium aluminum carbide (TiAlC) film is not limited to a film with 1:1:1 Ti:Al:C atoms. Rather, the chemical formulae are merely used to qualitatively indicate the components of the film. For example, a TiAlC film is made up of titanium, aluminum and carbon atoms in any appropriate ratio. In some embodiments, the liner 110 consists essentially of TiAlC. As used in this manner, the term "consists essentially of" means that the composition of the subject film is greater than or equal to 95%, 98%, 99% or 99.5% of the sum of the stated elements, on an atomic basis. In some embodiments, the liner 110 comprises or consists essentially of one or more of titanium (Ti), tantalum (Ta), cobalt (Co), nickel (Ni), molybdenum (Mo) or aluminum (Al). In some embodiments, the liner 110 comprises or consists essentially of titanium aluminum carbide (TiAlC) or one more of titanium (Ti), tantalum (Ta), cobalt (Co), nickel (Ni), molybdenum (Mo) or aluminum (Al). In some embodiments, the liner 110 comprises or consists essentially of one or more of titanium (Ti), tantalum (Ta), cobalt (Co), nickel (Ni), molybdenum (Mo), aluminum (Al) or carbon (C).

In some embodiments, the liner 110 comprises titanium. In some embodiments, the liner 110 consists essentially of titanium. In some embodiments, the titanium is deposited by ALD using one or more of titanium tetrachloride (TiCl$_4$), tetrakis(dimethylamino)titanium (TDMAT) or a mixture of TiCl$_4$ and 1-methyl-3,6-bis(trimethylsilyl)-1,4-cyclohexadiene. In some embodiments, the titanium precursor comprises or consists essentially of titanium tetrachloride (TiCl$_4$). As used herein, when referring to a reactive gas or precursor, the term "consists essentially of" means that the reactive species make up greater than or equal to 95%, 98%, 99% or 99.5% of the stated compound in the composition of the reactive gas. Diluent, carrier and inert gases are not included in the calculation of reactive species composition. In some embodiments, the titanium precursor comprises or consists essentially of tetrakis(dimethylamino)titanium (TDMAT).

In some embodiments, the titanium precursor comprises or consists essentially 1-methyl-3,6-bis(trimethylsilyl)-1,4-cyclohexadiene.

In some embodiments, the liner 110 comprises tantalum. In some embodiments, the liner 110 consists essentially of tantalum. In some embodiments, the tantalum is deposited by ALD using one or more of $TaCl_5$ or pentakis(diemthylamino)tantalum (PDMAT). In some embodiments, the tantalum precursor comprises or consists essentially of $TaCl_5$. In some embodiments, the tantalum precursor comprises or consists essentially of pentakis(diemthylamino) tantalum (PDMAT).

In some embodiments, the liner 110 comprises cobalt. In some embodiments, the liner 110 consists essentially of cobalt. In some embodiments, the cobalt is deposited by ALD using dicobalt hexacarbonyl tert-butylacetylene (CCTBA). In some embodiments, the cobalt precursor comprises dicobalt hexacarbonyl tert-butylacetylene (CCTBA). In some embodiments, the cobalt precursor consists essentially of dicobalt hexacarbonyl tert-butylacetylene (CCTBA).

In some embodiments, the liner 110 comprises nickel. In some embodiments, the liner 110 consists essentially of nickel. In one or more embodiments, the nickel is deposited by ALD using tetrakis(trifluorophosphine)nickel ($Ni(PF_3)_4$). In some embodiments, the nickel precursor comprises tetrakis(trifluorophosphine)nickel ($Ni(PF_3)_4$). In some embodiments, the nickel precursor consists essentially of tetrakis(trifluorophosphine)nickel ($Ni(PF_3)_4$).

In one or more embodiments, the liner 110 comprises aluminum. In some embodiments, the liner 110 consists essentially of aluminum. In some embodiments, the aluminum is deposited by ALD using one or more of dimethylaluminum hydride (DMAH), triethylaluminum (TEA) or trimethylaluminum (TMA). In one or more embodiments, the aluminum precursor comprises dimethylaluminum hydride (DMAH). In some embodiments, the aluminum precursor consists essentially of dimethylaluminum hydride (DMAH). In one or more embodiments, the aluminum precursor comprises triethylaluminum (TEA). In some embodiments, the aluminum precursor consists essentially of triethylaluminum (TEA). In one or more embodiments, the aluminum precursor comprises trimethylaluminum (TMA). In some embodiments, the aluminum precursor consists essentially of trimethylaluminum (TMA).

The liner 110 can be deposited at any suitable temperature. In some embodiments, the liner 110 is deposited at a temperature in the range of about 300° C. to about 500° C.

The liner 110 can have any suitable thickness depending on, for example, the species used in the liner 110, the substrate 105 and/or the metal film 120 composition to be deposited on top of the liner 110. In one or more embodiments, the liner 110 has a thickness sufficient to form a continuous film. As used herein, the term "continuous" refers to a layer or film that covers an entire exposed surface without gaps or bare spots that reveal material underlying the deposited layer. In some embodiments, the liner 110 has a thickness in the range of 30 Å to 100 Å.

In some embodiments, a reflector layer 120 is formed on or formed directly on the liner 110. As used in this manner, the term "formed directly on" means that there is no intervening layers between the stated layers. In some embodiments, after formation of the liner 110, the reflector layer 120 is formed without exposure to oxygen between. The term "without exposure to oxygen" means that the underlying film (e.g., the liner 110) is not exposed to an environment in which an oxide of the underlying film is formed. For example, the liner 110 is not exposed to air, water, water vapor, oxygen, ozone, peroxide, etc., before forming the reflector layer 120.

The reflector layer 120 can be formed by any suitable technique including, but not limited to, ALD, CVD, plasma-enhanced ALD, plasma-enhanced CVD, physical vapor deposition (PVD). In some embodiments, the liner 110 is formed by an ALD process and the reflector layer 120 is formed by a CVD process.

The reflector layer 120 of some embodiments is formed in the same process chamber as the liner 110. In some embodiments, the reflector layer 120 is formed in a different process chamber than the liner 110. In some embodiments, the reflector layer 120 is formed within the same process tool as the liner 110. A "process tool", also referred to as a cluster tool, as described further below, is a processing tool with a plurality of process chambers connected to a transfer station.

The reflector layer 120 of some embodiments comprises one or more of aluminum, tungsten, molybdenum or copper. In some embodiments, the reflector layer consists essentially of one or more of aluminum, tungsten, molybdenum or copper. In some embodiments, the reflector layer 120 has a different composition than the liner 110. In some embodiments, the reflector layer 120 has a different element than the liner 110. In some embodiments, the reflector layer 120 and the liner 110 have one or more common element and different compositions.

In some embodiments, the reflector layer 120 comprises or consists essentially of aluminum. In some embodiments, the aluminum is deposited by one or more of ALD or CVD using one or more of dimethylaluminum hydride (DMAH), triethylaluminum (TEA) or trimethylaluminum (TMA). In some embodiments, the aluminum is deposited by CVD using DMAH. In some embodiments, the aluminum is deposited by CVD using TEA. In some embodiments, the aluminum is deposited by CVD using TMA. In some embodiments, the aluminum precursor used to deposit the reflector layer 120 comprises or consists essentially of DMAH. In some embodiments, the aluminum precursor used to deposit the reflector layer 120 comprises or consists essentially of TEA. In some embodiments, the aluminum precursor used to deposit the reflector layer 120 comprises or consists essentially of TMA.

In some embodiments, the reflector layer 120 comprises or consists essentially of tungsten. In some embodiments, the tungsten is deposited by one or more of ALD or CVD using tungsten pentachloride ($WCl_5$). In some embodiments, the tungsten precursor used to form the reflector layer 120 comprises or consists essentially of tungsten pentachloride.

In some embodiments, the reflector layer 120 comprises or consists essentially of molybdenum. In some embodiments, the molybdenum is deposited by one or more of ALD or CVD using one or more of molybdenum pentachloride ($MoCl_5$) or molybdenum dichloride dioxide ($MoO_2Cl_2$). In some embodiments, the molybdenum is deposited by CVD using molybdenum pentachloride. In some embodiments, the aluminum is deposited by CVD using molybdenum dichloride dioxide. In some embodiments, the molybdenum precursor used to deposit the reflector layer 120 comprises or consists essentially of molybdenum pentachloride. In some embodiments, the molybdenum precursor used to deposit the reflector layer 120 comprises or consists essentially of molybdenum dichloride dioxide.

In some embodiments, the reflector layer 120 comprises or consists essentially of copper. In some embodiments, the copper is deposited by one or more of ALD or CVD using one or more of copper (I) chloride (CuCl) or copper (II)

chloride (CuCl$_2$). In some embodiments, the copper is deposited by CVD using copper (I) chloride. In some embodiments, the copper is deposited by CVD using copper (II) chloride. In some embodiments, the copper precursor used to deposit the reflector layer 120 comprises or consists essentially of copper (I) chloride. In some embodiments, the copper precursor used to deposit the reflector layer 120 comprises or consists essentially of copper (II) chloride.

In some embodiments, the reflector layer 120 is deposited at a temperature in the range of 100° C. to 500° C., or in the range of 150° C. to 450° C., or in the range of 200° C. to 400° C. In some embodiments, the reflector layer 120 is deposited at a pressure in the range of 0.5 Torr to 100 Torr, or in the range of about 1 Torr to about 50 Torr, or in the range of 5 Torr to 25 Torr.

Figure 3B:
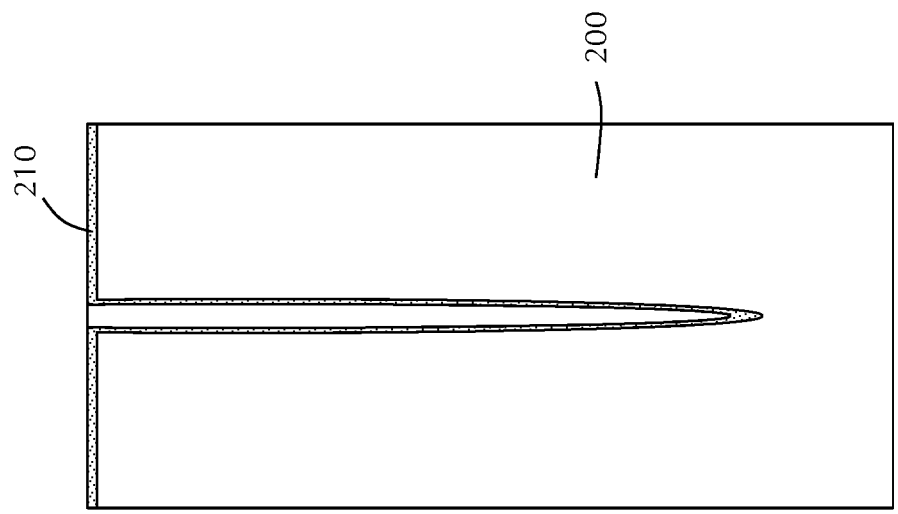
Figure 3A:
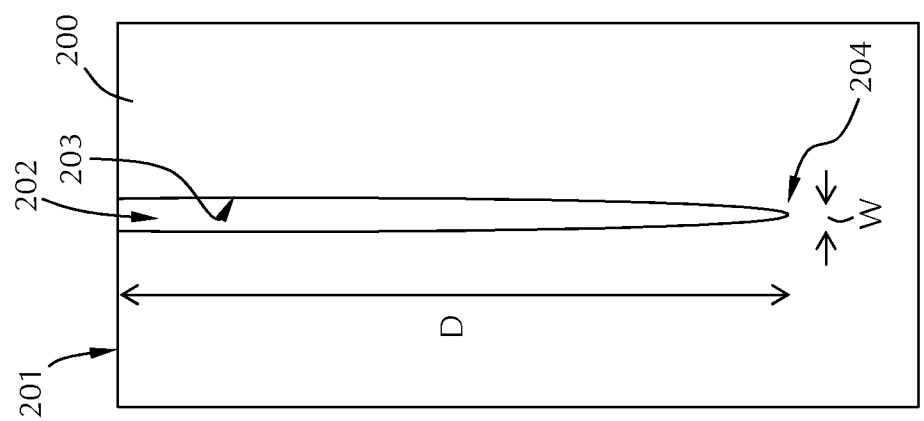

Referring now to FIGS. 3A through 3G, one or more embodiments of the disclosure are directed to methods of forming a reflector film stack on a structured substrate 200. The structured substrate 200 is a substrate that has at least one structure (also referred to as a feature) formed therein. The structure 202 of some embodiments, as shown in FIG. 3A, comprises at least one sidewall 203 and a bottom 204. In the illustrated embodiment, the structure 202 has a tapered profile extending a depth D from a top surface 201 of the structured substrate 200 to the bottom 204. The width W of the structure 202 is measured at the top surface 201 of the substrate 200. In some embodiments, the aspect ratio of the structure 202, measured as the depth D to width W of the structure 202, is greater than 50:1. In some embodiments, the aspect ratio of the structure 202 is greater than 60:1, 70:1, 80:1, 90:1 or 100:1. The particular shape of the structure 202 illustrated is merely representative of one possible shape and should not be taken as limiting the scope of the disclosure. The number of sidewalls 203 on the structure 202 depend on the shape of the structure 202 are should not be taken as limiting the scope of the disclosure.

As shown in FIG. 3B, a conformal liner 210 is formed on the substrate 200 and the at least one structure 202. The conformal liner 210 can be any of the materials and formed by any of the processes described previously.

Figure 3D:
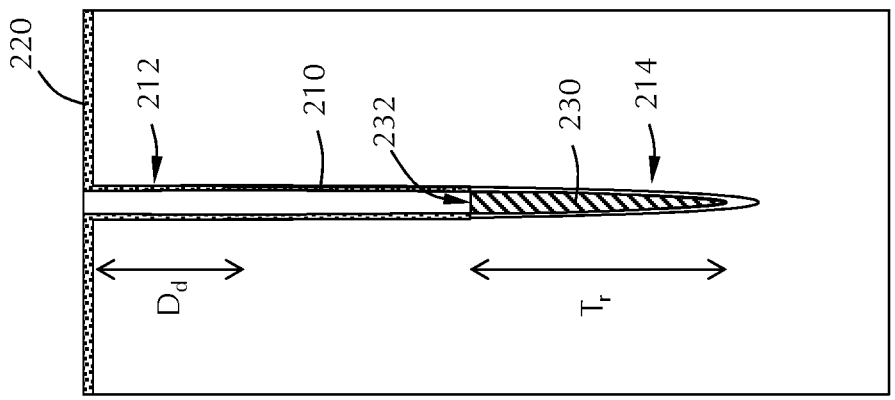
Figure 3C:
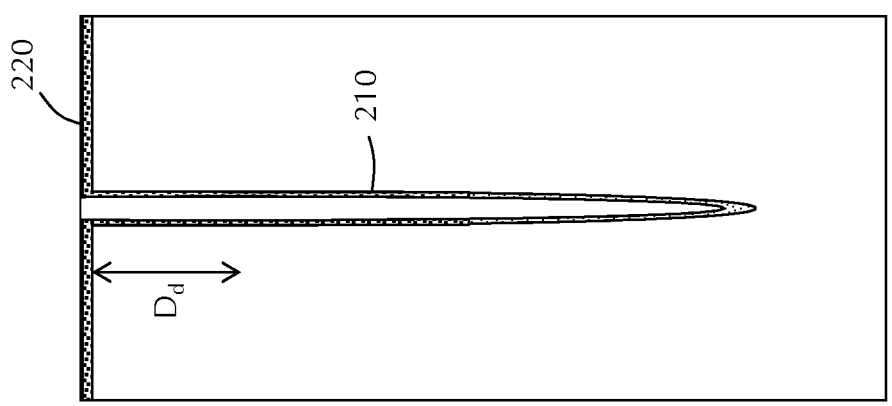

After deposition of the conformal liner 210, as shown in FIG. 3C, the substrate 200 is exposed to a growth inhibitor. The growth inhibitor of some embodiments deactivates the top surface 201 of the substrate 200, forming a deactivated liner 220. At this point, the top surface 201 of the substrate 200 includes the conformal liner 210. Stated differently, the growth inhibitor of some embodiments deactivates the conformal liner 210 on the top surface 201 of the substrate 200. In some embodiments, the growth inhibitor deactivates a top portion 212 of the conformal liner 210 in the structure 202. In some embodiments, the growth inhibitor deactivates a top portion of the substrate. As used in this manner, the top portion of the substrate 200 refers to the top surface 201 of the substrate 200 and the top portion 206 of the structure 202. The growth inhibitor of some embodiments deactivates the conformal liner 210 to a depth $D_d$ from the top surface 201 of the substrate 200. The depth $D_d$ of the deactivated liner 220 of some embodiments is in the range of 10% to 90%, or 20% to 80%, or 30% to 70% or 40% to 60% or about 50% of the depth D of the structure 202.

The growth inhibitor of some embodiments comprises a compound that reacts with the liner 210 to form a surface or material that is unfavorable for deposition of the reflector layer material. In some embodiments, the growth inhibitor comprises a carbon-based material. In some embodiments, the growth inhibitor comprises or consists essentially of TEA.

In FIG. 3D, a reflector layer 230 is formed on the conformal liner 210 within the at least one structure 202. The reflector layer 230 is formed to an inhibited thickness $T_r$, measured from the conformal liner 210 on the bottom 204 of the structure 202. In some embodiments, the inhibited thickness $T_r$ is in the range of 10% to 90%, or 20% to 80%, or 30% to 70% or 40% to 60% or about 50% of the depth D of the structure 202. In some embodiments, the inhibited thickness $T_r$ is sufficient to bring a top surface 232 of the reflector layer 230 to the depth $D_d$ of the deactivated liner 220. In some embodiments, the inhibited thickness $T_r$ is less than the thickness to reach the deactivated liner 220. In some embodiments, the inhibited thickness $T_r$ brings the top surface 232 of the reflector layer 230 to the top portion 206 of the structure, within the region of the structure 206 bounded by the deactivated liner 220.

In some embodiments, as shown in FIG. 3E, the top portion 206 of the substrate 200 is reactivated to replace the deactivated liner 220 with the conformal liner 210. In some embodiments, the substrate is reactivated by exposing the substrate surface to titanium tetrachloride at the same temperature and process conditions of liner deposition.

As shown in FIG. 3F, according to some embodiments, the structure 202 is filled with the reflector layer 230. In some embodiments, the reflector layer 230 is deposited to form an overburden 235 on the top surface of the substrate 200. In some embodiments, the overburden 235 is on the conformal liner 210 on the substrate 200. In some embodiments, the overburden 235 is directly on the substrate 200 without the conformal liner 210.

FIG. 3G illustrates the substrate 200 with the reflector layer 230 deposited to the top surface 201 of the substrate 200. In some embodiments, the overburden 235 illustrated in FIG. 3F is removed by any suitable technique to expose the top surface 201 of the substrate 200 and the top surface 211 of the conformal liner 210 within the structure 202. In some embodiments, the overburden 235 is removed to lower the top surface 232 of the reflector layer 230 to be even with the top surface 211 of the conformal liner 210. In some embodiments, the conformal liner 210 overlies the top surface 201 of the substrate 200 and the reflector layer 230 has a top surface 232 even with the top surface 211 of the conformal liner 210. In some embodiments, the overburden 235, and optionally the conformal liner 210 on the top surface 201 of the substrate 200, is removed by one or more of chemical-mechanical planarization (CMP) or etching.

Figure 4:
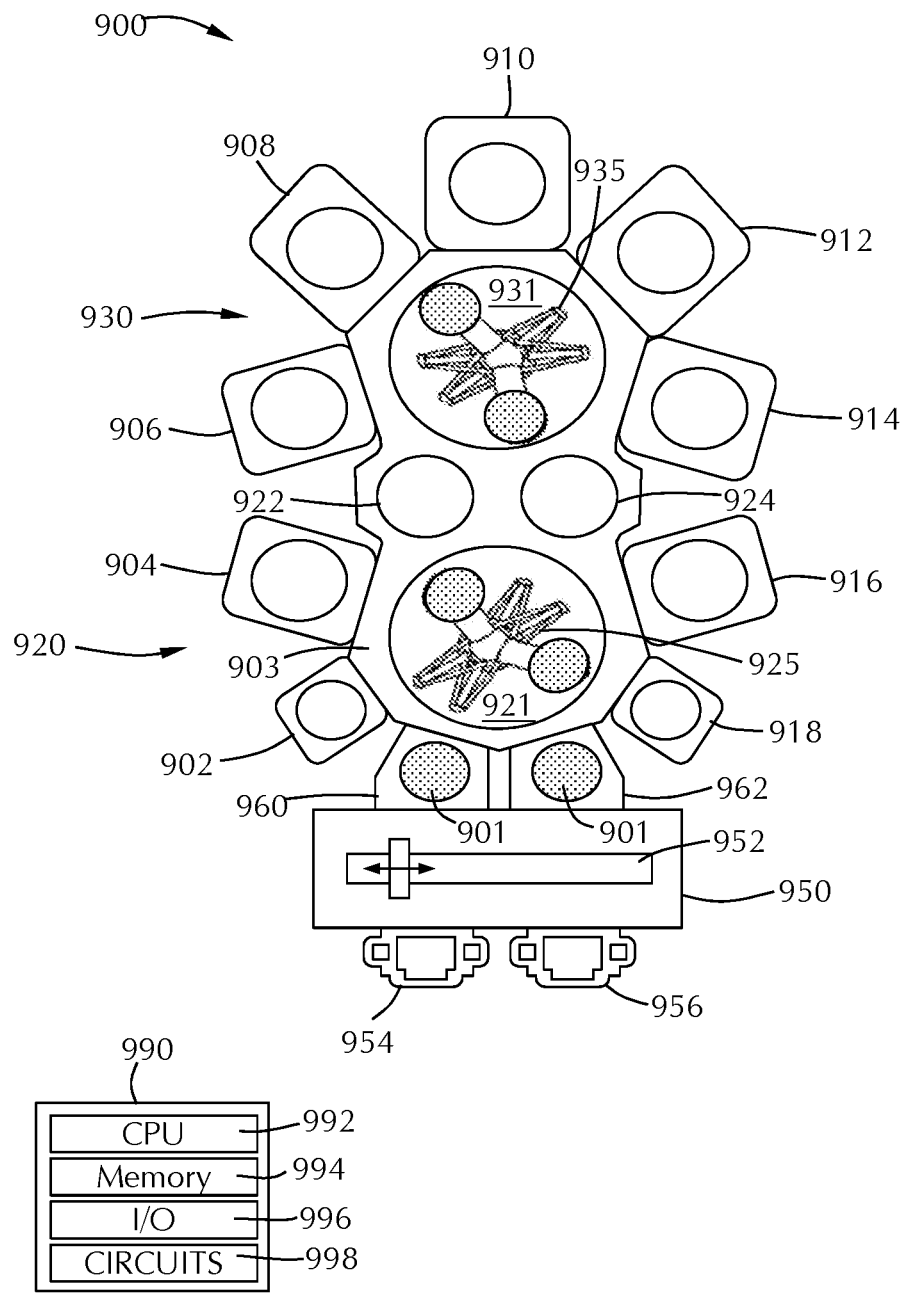
FIG. 4 illustrates a process tool for use with methods according to one or more embodiment of the disclosure.

Additional embodiments of the disclosure are directed to process tools 900 for the formation of the devices and practice of the methods described, as shown in FIG. 4. The process tool 900, also referred to as a cluster tool, includes at least one central transfer station 921, 931 with a plurality of sides. A robot 925, 935 is positioned within the central transfer station 921, 931 and is configured to move a robot blade and a wafer to each of the plurality of sides.

The process tool 900 comprises a plurality of processing chambers 902, 904, 906, 908, 910, 912, 914, 916, and 918, also referred to as process stations, connected to the central transfer station. The various processing chambers provide separate processing regions isolated from adjacent process stations. The processing chamber can be any suitable chamber including, but not limited to, a physical vapor deposition chamber, a UV curing chamber, an ICP chamber, an etching chamber, and the like. The particular arrangement of process chambers and components can be varied depending on the cluster tool and should not be taken as limiting the scope of the disclosure.

In some embodiments, the process tool 900 includes at least one atomic layer deposition chamber connected to the central transfer station. In some embodiments, the process tool 900 includes at least one chemical vapor deposition chamber connected to the central transfer station.

In the embodiment shown in FIG. 4, a factory interface 950 is connected to a front of the process tool 900. The factory interface 950 includes a loading chamber 954 and an unloading chamber 956 on a front 951 of the factory interface 950. While the loading chamber 954 is shown on the left and the unloading chamber 956 is shown on the right, those skilled in the art will understand that this is merely representative of one possible configuration.

The size and shape of the loading chamber 954 and unloading chamber 956 can vary depending on, for example, the substrates being processed in the process tool 900. In the embodiment shown, the loading chamber 954 and unloading chamber 956 are sized to hold a wafer cassette with a plurality of wafers positioned within the cassette.

A robot 952 is within the factory interface 950 and can move between the loading chamber 954 and the unloading chamber 956. The robot 952 is capable of transferring a wafer from a cassette in the loading chamber 954 through the factory interface 950 to load lock chamber 960. The robot 952 is also capable of transferring a wafer from the load lock chamber 962 through the factory interface 950 to a cassette in the unloading chamber 956. As will be understood by those skilled in the art, the factory interface 950 can have more than one robot 952. For example, the factory interface 950 may have a first robot that transfers wafers between the loading chamber 954 and load lock chamber 960, and a second robot that transfers wafers between the load lock 962 and the unloading chamber 956.

The process tool 900 shown has a first section 920 and a second section 930. The first section 920 is connected to the factory interface 950 through load lock chambers 960, 962. The first section 920 includes a first transfer chamber 921 with at least one robot 925 positioned therein. The robot 925 is also referred to as a robotic wafer transport mechanism. The first transfer chamber 921 is centrally located with respect to the load lock chambers 960, 962, process chambers 902, 904, 916, 918, and buffer chambers 922, 924. The robot 925 of some embodiments is a multi-arm robot capable of independently moving more than one wafer at a time. In some embodiments, the first transfer chamber 921 comprises more than one robotic wafer transfer mechanism. The robot 925 in first transfer chamber 921 is configured to move wafers between the chambers around the first transfer chamber 921. Individual wafers are carried upon a wafer transport blade that is located at a distal end of the first robotic mechanism.

After processing a wafer in the first section 920, the wafer can be passed to the second section 930 through a pass-through chamber. For example, chambers 922, 924 can be uni-directional or bi-directional pass-through chambers. The pass-through chambers 922, 924 can be used, for example, to cryo cool the wafer before processing in the second section 930, or allow wafer cooling or post-processing before moving back to the first section 920.

A system controller 990 is in communication with the first robot 925, second robot 935, first plurality of processing chambers 902, 904, 916, 918 and second plurality of processing chambers 906, 908, 910, 912, 914. The system controller 990 can be any suitable component that can control the processing chambers and robots. For example, the system controller 990 can be a computer including a central processing unit (CPU) 992, memory 994, inputs/outputs (I/O) 996, and support circuits 998. The controller 990 may control the processing tool 900 directly, or via computers (or controllers) associated with particular process chamber and/or support system components.

In one or more embodiments, the controller 990 may be one of any form of general-purpose computer processor that can be used in an industrial setting for controlling various chambers and sub-processors. The memory 994 or computer readable medium of the controller 990 may be one or more of readily available memory such as non-transitory memory (e.g. random access memory (RAM)), read only memory (ROM), floppy disk, hard disk, optical storage media (e.g., compact disc or digital video disc), flash drive, or any other form of digital storage, local or remote. The memory 994 can retain an instruction set that is operable by the processor (CPU 992) to control parameters and components of the processing tool 900.

The support circuits 998 are coupled to the CPU 992 for supporting the processor in a conventional manner. These circuits include cache, power supplies, clock circuits, input/output circuitry and subsystems, and the like. One or more processes may be stored in the memory 994 as software routine that, when executed or invoked by the processor, causes the processor to control the operation of the processing tool 900 or individual processing units in the manner described herein. The software routine may also be stored and/or executed by a second CPU (not shown) that is remotely located from the hardware being controlled by the CPU 992.

Some or all of the processes and methods of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In some embodiments, the controller 990 has one or more configurations to execute individual processes or sub-processes to perform the method. The controller 990 can be connected to and configured to operate intermediate components to perform the functions of the methods. In some embodiments, the controller 990 is connected to and configured to control one or more of an atomic layer deposition chamber or a chemical vapor deposition chamber.

Processes may generally be stored in the memory 994 of the system controller 990 as a software routine that, when executed by the processor, causes the process chamber to perform processes of the present disclosure. The software routine may also be stored and/or executed by a second processor (not shown) that is remotely located from the hardware being controlled by the processor. Some or all of the method of the present disclosure may also be performed in hardware. As such, the process may be implemented in software and executed using a computer system, in hardware as, e.g., an application specific integrated circuit or other type of hardware implementation, or as a combination of software and hardware. The software routine, when executed by the processor, transforms the general purpose computer into a specific purpose computer (controller) that controls the chamber operation such that the processes are performed.

In one or more embodiments, a processing tool comprises: a central transfer station comprising a robot configured to move a wafer; a plurality of process stations, each process station connected to the central transfer station and providing a processing region separated from processing regions of adjacent process stations, the plurality of process stations comprising a physical vapor deposition chamber and a remote plasma source; a UV curing chamber; an ICP chamber; and a controller connected to the central transfer station and the plurality of process stations, the controller configured to activate the robot to move the wafer between process stations, and to control a process occurring in each of the process stations.

In some embodiments, the controller 990 has one or more of: a configuration to move a substrate from the central transfer station to the at least one deposition chamber; a configuration to move a substrate from the at least one deposition chamber to the central transfer station; a configuration to form a conformal liner on a substrate in an atomic layer deposition chamber; a configuration to expose a substrate to a growth inhibitor; a configuration to form a first portion of a reflector layer; a configuration to expose the substrate a material to reactivate the substrate; and a configuration to form a second portion of the reflector layer.

Some embodiments of the disclosure are directed to non-transitory computer readable medium including instructions, that, when executed by a controller of a processing chamber, causes the processing chamber to perform operations to: deposit a conformal liner on a substrate in a first process chamber connected to a central transfer station having a robot therein; move a substrate from the first process chamber to a second process chamber connected to the central transfer station so that the substrate is not exposed to oxygen; expose the substrate to a growth inhibitor in one or more of the first process chamber, the central transfer station or the second process chamber; form a reflector layer on the liner in the second process chamber; and expose the substrate to a reactivating agent.

Reference throughout this specification to "one embodiment," "certain embodiments," "one or more embodiments" or "an embodiment" means that a particular structure, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular structures, structures, materials, or characteristics may be combined in any suitable manner in one or more embodiments.

Although the disclosure herein has been described with reference to particular embodiments, those skilled in the art will understand that the embodiments described are merely illustrative of the principles and applications of the present disclosure. It will be apparent to those skilled in the art that various modifications and variations can be made to the method and apparatus of the present disclosure without departing from the spirit and scope of the disclosure. Thus, the present disclosure can include modifications and variations that are within the scope of the appended claims and their equivalents.

What is claimed is:

1. A method of forming a reflector film stack, the method comprising:
    forming a conformal liner on a substrate having at least one structure formed therein, the at least one structure having a bottom and sidewalls;
    exposing the substrate to a growth inhibitor to deactivate a top portion of the substrate;
    forming a reflector layer on the liner within the at least one structure to an inhibited thickness;
    reactivating the top portion of the substrate; and
    filling the at least one structure with the reflector layer.

2. The method of claim 1, wherein the liner comprises titanium and is deposited using $TiCl_4$, tetrakis(dimethylamino)titanium (TDMAT) or 1-methyl-3,6-bis(trimethylsilyl)-1,4-cyclohexadiene.

3. The method of claim 1, wherein the liner comprises tantalum and is deposited using one or more of $TaCl_5$ or pentakis(diemthylamino)tantalum (PDMAT).

4. The method of claim 1, wherein the liner comprises cobalt and is deposited using dicobalt hexacarbonyl tert-butylacetylene (CCTBA).

5. The method of claim 1, wherein the liner comprises nickel and is deposited using tetrakis(trifluorophosphine) nickel ($Ni(PF_3)_4$).

6. The method of claim 1, wherein the liner comprises aluminum and is deposited using one or more of dimethylaluminum hydride (DMAH), triethylaluminum (TEA) or trimethylaluminum (TMA).

7. The method of claim 1, wherein the liner has a thickness in the range of 30 Å to 50 Å.

8. The method of claim 1, wherein the reflector layer has a different composition than the liner.

9. The method of claim 1, wherein the reflector layer comprises aluminum and is deposited using one or more of dimethylaluminum hydride (DMAH), triethylaluminum (TEA) or trimethylaluminum (TMA).

10. The method of claim 1, wherein the reflector layer comprises tungsten and is deposited using tungsten pentachloride ($WCl_5$).

11. The method of claim 1, wherein the reflector layer comprises molybdenum and is deposited using one or more of molybdenum pentachloride ($MoCl_5$) or molybdenum dichloride dioxide ($MoO_2Cl_2$).

12. The method of claim 1, wherein the reflector layer comprises copper and is deposited using one or more of copper (I) chloride (CuCl) or copper (II) chloride ($CuCl_2$).

13. The method of claim 1, wherein the liner comprises TiAlC or one or more of titanium (Ti), tantalum (Ta), cobalt (Co), nickel (Ni), molybdenum (Mo) or aluminum (Al).

14. The method of claim 1, wherein the reflector layer comprises one or more of aluminum, tungsten, molybdenum or copper.

15. The method of claim 1, wherein the conformal liner comprises titanium aluminum carbide (TiAlC), the reflector layer comprises aluminum, exposing the substrate to the growth inhibitor comprises soaking the substrate in triethylaluminum (TEA), and reactivating the top portion of the substrate comprises exposing the substrate to titanium tetrachloride ($TiCl_4$).

16. The method of claim 1, wherein the reflector layer is formed within the same process tool as the liner without exposure to oxygen between.

17. A non-transitory computer readable medium including instructions, that, when executed by a controller of a processing tool, causes the processing tool to perform operations of:
    depositing a conformal liner on a substrate in a first process chamber connected to a central transfer station having a robot therein;
    moving the substrate from the first process chamber to a second process chamber connected to the central transfer station so that the substrate is not exposed to oxygen;

exposing the substrate to a growth inhibitor in one or more of the first process chamber, the central transfer station or the second process chamber;

forming a reflector layer on the liner in the second process chamber; and exposing the substrate to a reactivating agent.

* * * * *